Figure 1:
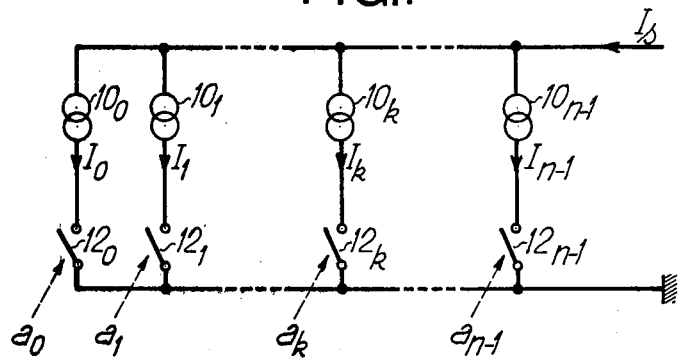

United States Patent [19]

Laures

[11] 4,352,093
[45] Sep. 28, 1982

[54] HIGH-SPEED DIGITAL/ANALOG CONVERTER

[76] Inventor: Antoine Laures, 16, rue d'Arcueil, 92120 Montrouge, France

[21] Appl. No.: 220,035
[22] PCT Filed: Apr. 15, 1980
[86] PCT No.: PCT/FR80/00059
  § 371 Date: Dec. 19, 1980
  § 102(e) Date: Dec. 4, 1980
[87] PCT Pub. No.: WO80/02348
  PCT Pub. Date: Oct. 30, 1980

[51] Int. Cl.³ .............................................. H03K 13/02
[52] U.S. Cl. .............................................. 340/347 DA
[58] Field of Search ................................. 340/347 DA

[56] References Cited

U.S. PATENT DOCUMENTS

| | | | |
|---|---|---|---|
| 2,869,115 | 1/1959 | Doeleman | 340/347 DA |
| 2,956,272 | 10/1960 | Cohler | 340/347 DA |
| 2,994,862 | 8/1961 | Preston | 340/347 DA |
| 3,217,147 | 11/1965 | Chapman | 340/347 DA |
| 3,299,315 | 1/1967 | McMillan | 340/347 DA |

FOREIGN PATENT DOCUMENTS

| | | |
|---|---|---|
| 2291649 | 6/1976 | France . |
| 1194307 | 6/1970 | United Kingdom . |
| 1438308 | 6/1976 | United Kingdom . |

Primary Examiner—Charles D. Miller

[57] ABSTRACT

High-speed, digital/analog converter using a logic circuit with coupled emitters comprising a first stage formed by logic gates having a plurality of inputs and one output and a second current amplification stage formed by the same number of transistors as there are logic gates, e.g. transistor having an emitter, a base and a collector, each case of a transistor of the second stage being connected to the output of a logic gate of the first stage, said logic circuit also having a first supply line and a voltage $V_{cc1}$ and connected to all the collectors of the transistors of the amplification stage, a second supply line at voltage $V_{cc2}$, which differs from the first and is connected to the logic gates of the first stage and a third supply line at a voltage $V_{EE}$ and connected to the two stages, wherein the converter comprises resistors connected to the emitters of transistors, resistor connected to the transistor of rank k having the value $R/2^k$, while all the resistors are joined in parallel to the line $V_{EE}$, a matched load line connected to the first line $V_{cc1}$ via a constant current subtracting circuit, each bit of rank k of the digital signal to be converted being applied to the input of the logic gate connected to the transistor of the same rank k, the analog conversion signal being constituted by the total current $I_s$ flowing in the load line.

3 Claims, 5 Drawing Figures

HIGH-SPEED DIGITAL/ANALOG CONVERTER

The present invention relates to a high-speed digital/analog converter. It is used in electronics, for example in the signal processing field and more specifically in high throughput digital/analog conversion and in amplitude modulation with several levels and a high throughput.

A digital/analog converter is a circuit in which an analog magnitude E corresponds to a classified system of bits $a_k$ in accordance with the equation:

$$E = E_o \sum_{k=0}^{k=n-1} a_k 2^k \quad (1)$$

in which the symbol k designates the rank of the bits varying from 0 to n-1 and the coefficient $E_o$ is a reference magnitude. Generally, the analog magnitude is of an electrical nature (current or voltage).

The block diagram of a digital/analog converter is shown in FIG. 1. Such a circuit comprises n current generators $10_0, 10_1 \ldots 10_k \ldots 10_{n-1}$ and n switches $12_0, 12_1 \ldots 12_k, \ldots 12_{n-1}$. The generators are able to supply currents $I_0, I_1 \ldots I_k \ldots I_{n-1}$, whose values are in the form:

$$I_k = I_0 2^k \quad (2)$$

The bits of the digital signal to be converted determine the state (switched on or off) of the circuit switches. A zero bit controls the switching off of the corresponding switch and a bit equal to 1 its switching on. The total current $I_s$ supplied by such a circuit is therefore in the form:

$$I_s = \sum_k I_k \quad (3)$$

or $$I_s = I_0 \sum_k a_k 2^k$$

the above expression being identical to that of equation (1).

Figure 2:
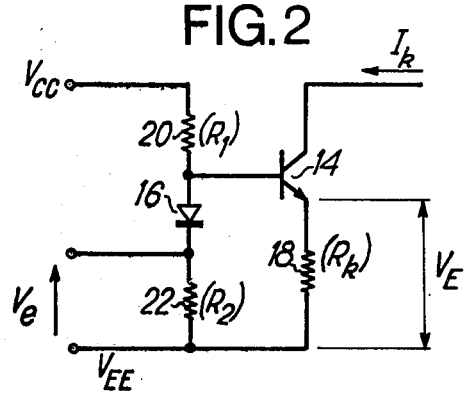

The current generators most frequently encountered in this application are shown in FIG. 2. They comprise a transistor 14, a diode 16, a resistor 18 of value $R_k$ and two resistors 20 and 22 of values $R_1$ and $R_2$. The circuit is completed by two supply connections at voltages $V_{cc}$ and $V_{EE}$. The useful voltage is the current $I_k$ of the transistor collector.

The circuit operates as follows. Diode 16 compensates the base-emitter displacement voltage of transistor 14. The voltage $V_E$ at the terminals of resistor 18 is then equal to the voltage $V_E$ at the terminals of resistor 22. On ignoring the base current compared with the collector current, it is possible to write:

$$I_k = \frac{-V_e}{R_k} \quad (4)$$

In order to form a digital/analog converter with such generators, it is merely necessary to associate therewith a series with the resistors $R_k$ forming a geometrical progression of ratio $\frac{1}{2}$: $R_k = R/2^k$.

The total current $I_s$ is then:

$$I_s = \frac{V_e}{R} \sum_k a_k \cdot 2^k \quad (5)$$

The present invention relates to such as converter, but which operates at a higher speed than the prior art converters described hereinbefore.

To this end, the current generators and switches are constructed in a special way in accordance with the so-called "coupled emitter technology" (or abbreviated to ECL for Emitter-coupled logic).

Before describing the features of the invention, the principles of ECL integrated circuits are briefly described. Bipolar logic circuits can be distributed into two basic categories, as a function of their operating mode. The first category includes saturated logics (resistor, transistor logic RTL, diode, transistor logic DTL and transistor, transistor logic TTL), whilst the other category covers the non-saturated logics coupled in the current mode (current mode logic CML, emitter-coupled logic ECL and emitter-coupled, current slaved logic ECCSL).

Figure 3:
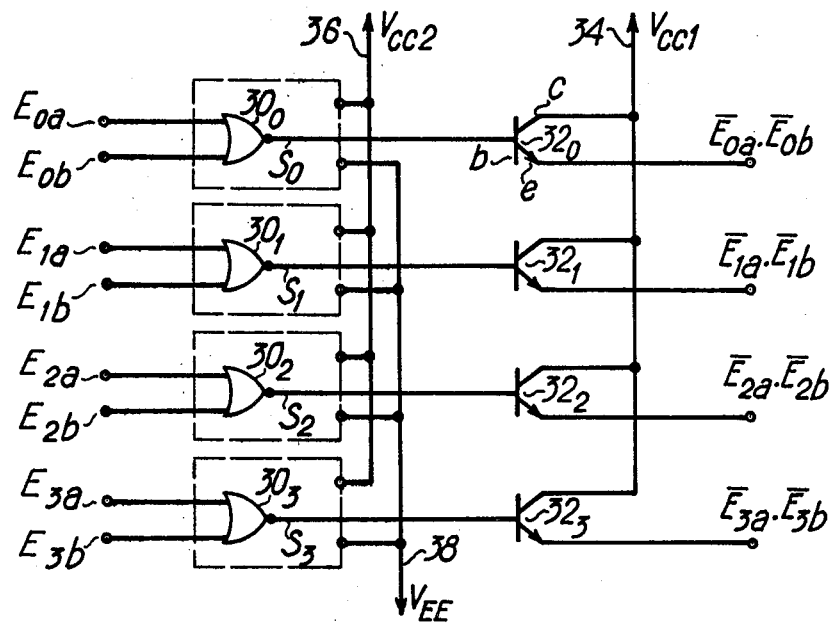

The present invention uses a circuit type belonging to the second category, namely the ECL type. Such a logic circuit is shown in FIG. 3 in the case of a NOR quadruple. It comprises a first purely logic stage formed from four logic gates ($30_0, 30_1, 30_2, 30_3$) each having two inputs respectively ($E_{oa}, E_{ob}$)($E_{1a}, E_{1b}$) ($E_{2a}, E_{2b}$) and ($E_{3a}, E_{3b}$) and one output respectively ($S_0, S_1, S_2, S_3$) and a second current amplification stage formed by four transistors $32_0, 21_1, 32_2$ and $32_3$, each having a base b, an emitter e and a collector c, the base of one transistor being connected to the output of the preceding logic gate.

The circuit also has a first supply line 34 at a voltage $V_{cc1}$, said line being connected to all the collectors c of the transistors 32, a second supply line 36 at a second voltage $V_{cc2}$ and a third line 38 at voltage $V_{EE}$.

The two voltages $V_{cc1}$ and $V_{cc2}$ are obtained by not shown sources, which are separate in order to prevent large current variations appearing at the output of the circuit from having repercussions on the input circuits which are particularly sensitive to interference.

In the diagram of FIG. 3, the logic gates are of the NOR type. If $E_a$ and $E_b$ designate the logic states of the two inputs of one of these gates, the emitter of a corresponding output transistor supplies a signal equal to $\overline{E_a \cdot E_b}$ in which the horizontal line indicates the logic complementation operation and the dot the AND operation.

The present invention utilizes the exceptional properties of ECL circuits with regard more particularly to the high speed for producing a high-speed, digital/analog converter. This constitutes a novel application of the circuits, which have hitherto only been used as logic circuits.

The invention utilizes a logic circuit of the ECL type, whereby the logic functions are naturally not necessarily of the NOR type. The converter according to the invention is also characterized in that it comprises resistors connected to the emitters of the output transistors, the resistor connected to the transistor of rank k having the value $R/2^k$, all the resistors being joined in parallel to the line $V_{EE}$ and a matched load line connected to the first line $V_{cc1}$ by means of a constant current subtraction circuit.

With such a circuit, each bit of the digital signal to be converted is applied, in accordance with its rank k, to the input of the logic gate connected to the transistor of the same rank k, the analog conversion signal then being constituted by the current flowing in the load line.

The invention is described in greater detail hereinafter relative to non-limitative embodiments and the attached drawings, wherein show:

FIG. 1, already described, the block diagram of a digital/analog converter.

FIG. 2, also described, a current source used in the prior art converters.

FIG. 3, also described, the block diagram of an integrated logic circuit of the ECL type.

Figure 4:
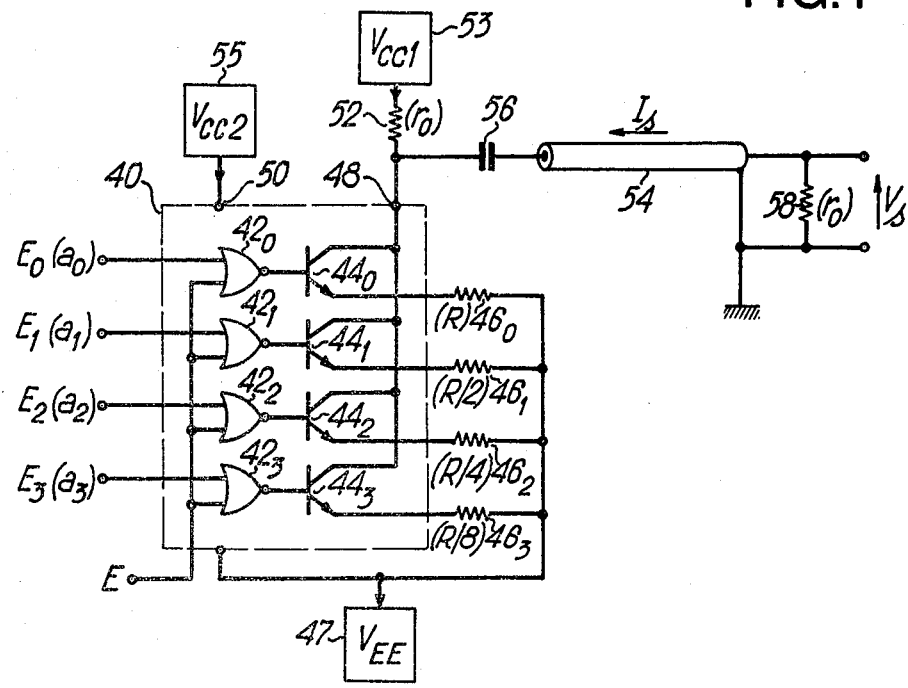

FIG. 4 the block diagram of a converter according to the invention.

Figure 5:
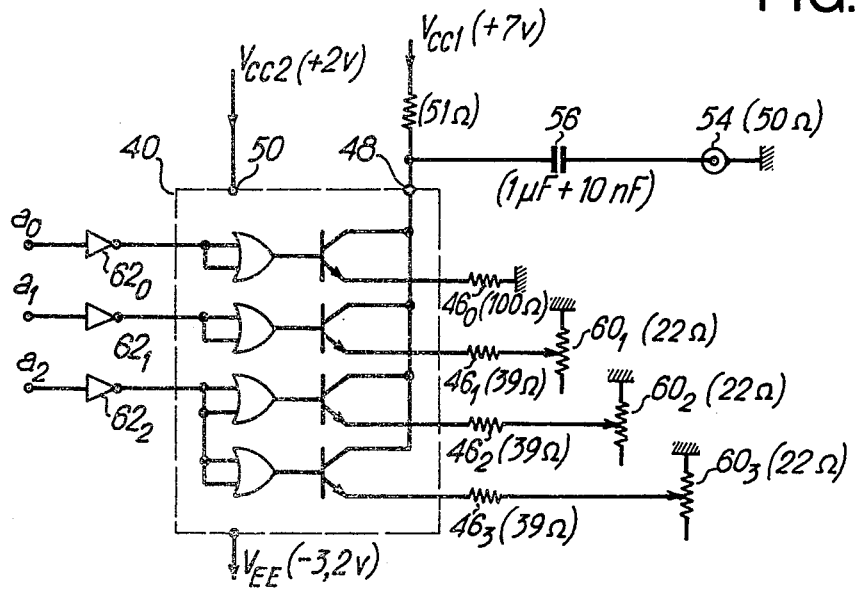

FIG. 5 an embodiment of a converter according to the invention based on a special commercial logic circuit.

The converter of FIG. 4 uses an integrated circuit 40 which is a quadruple NOR gate formed from four elementary NOR gates $42_0$, $42_1$, $42_2$ and $42_3$, each having two inputs, whereof one E is common to all the gates, whilst the others $E_0$, $E_1$, $E_2$ and $E_3$ receive the bits $a_0, a_1, a_2, a_3$ of the number to be converted. The integrated circuit 40 comprises four transistors $44_0$, $44_1$, $44_2$, $44_3$, whose bases are connected to the output of the preceding logic NOR gates and the emitters to the resistors $46_0$, $46_1$, $46_2$ and $46_3$ of respective values R, R/2, R/4 and R/8. All the resistors are connected to a voltage source 47 of value $V_{EE}$. The integrated circuit 40 also has two output pins 48, 50, the first connected across a resistor 52 of value $r_0$ to a voltage source 52 of value $V_{cc1}$ and the second to a voltage source 55 of value $V_{cc2}$.

Moreover, the pin 48 is connected to a line 54 across a capacitor 56 having the function of blocking the direct current component. Line 54 has a characteristic impedance which is equal to the value $r_0$ of resistor 52 and is closed on a load resistor 52 and on a load resistor 58, whose value is equal to $r_0$. A current $I_s$ flows in line 54 and a voltage $V_s$ appears at the terminals of load resistor 58.

The circuit operates in the following manner. If the voltage difference on the emitters between logic levels 0 and 1 is designated by $\Delta V$, the voltage $V_{ek}$ appearing on the emitter of the transistor of rank k is of the form: $V_{ek} = V_0 + a_k \Delta V$.

The total current flowing in the absence of the blocking capacitor 56 is equal to:

$$\frac{2^4 \cdot V_0}{R} + \frac{\Delta V}{R} \sum_{k=0}^{3} a_k 2^k \quad (6)$$

Capacitor 56 has the effect of blocking the continuous or direct component. The current $I_s$ finally has the value:

$$I_s = \frac{\Delta V}{R} \sum_{k=0}^{3} a_k 2^k \quad (7)$$

This current has a real load of value $r_0/2$ and gives rise to an output voltage $V_s$ of value:

$$V_s = \frac{r_0}{2R} \Delta V \sum_{k=0}^{k=3} a_k 2^k \quad (8)$$

or $$V_s = \frac{r_0}{2R} \Delta V (8a_3 + 4a_2 + 2a_1 + a_0) \quad (9)$$

This is a characteristic relationship of a digital/analog converter.

FIG. 5 is an embodiment of a converter with 3 bits according to the invention using a commercial logic circuit, in the present case circuit MC 1664 manufactured by MOTOROLA. This circuit 40 is a quadruple OR circuit, which may be preferred to the quadruple NOR circuit of the previous drawing, which has the defect of having a logic level 0 which is slightly dependent on the input voltage. Three inverting gates $62_0$, $62_1$ and $62_2$ receive the three bits $a_0$, $a_1$ and $a_2$ of the number to be converted.

The variant of FIG. 5 also has the special feature of using potentiometers $60_1$, $60_2$, $60_3$ arranged in series with the emitter resistors $46_1$, $46_2$ and $46_3$ for compensating a possible dispersion of the logic levels supplied by the four logic gates.

It should also be noted that two elementary logic gates are used for the high weight bit ($a_2$). This arrangement makes it possible to double the output voltage without exceeding the minimum value for the emitter resistor recommended by the manufacturer, namely 50Ω.

The MC 1664 circuit used in the present embodiment has a voltage difference between the logic levels 0 and 1 measured on the emitter: $\Delta V = 0.86$ V at 25° C. and a logic circuit rise and fall time measured at the same access of approximately 2 ns on a 50Ω load.

The voltage $V_s$ appearing on the load resistor can be calculated by using the equation (9) with $r_0$: 50Ω and R = 100Ω:

$$V_s = 0.22(4a_2 + 2a_1 + a_0) \quad (10)$$

Measurements performed by the Applicant on a circuit like that of FIG. 5 have shown that the voltage difference between two adjacent levels is approximately 0.2 V, which is in good agreement with equation (10) and that the rise and fall times are approximately 3 ns, slightly above the corresponding times of circuit MC 1664. This variation is explained by the fact that the signal is sampled from a transistor collector, which is hardly favourable to obtaining a rapid response, due to the base-emitter reaction capacitance of the transistor. However, this value is remarkable for such a simple converter. The Applicant has made such a converter work up to 170 MHz, a frequency which had never previously been reached with a digital/analog converter.

I claim:

1. A high-speed, digital/analog converter comprising: a logic circuit with coupled emitters comprising a first stage formed by logic gates having a plurality of inputs and one output and a second, current amplification stage formed by the same number of transistors as there are logic gates, each transistor having an emitter, a base and a collector, each base of a transistor of the second stage being connected to the output of a logic gate of the first stage, said logic circuit also having a first supply line and a voltage $V_{cc1}$ and connected to all the collectors of the transistors of the amplification stages, a second supply line at voltage $V_{cc2}$, which differs from the first and is connected to the logic gates of the first stage, and a third supply line at a voltage $V_{EE}$ and connected to the two stages, and resistors connected to the emitters of the transistors, the resistor connected to the transistor of rank k having the value $R/2^k$, while all the resistors are joined in parallel to the line $V_{EE}$, a matched load line connected to the first line $V_{cc1}$ via a capacitor, each bit of rank k of the digital signal to be converted being applied to the input of the logic gate connected to the transistor of the same rank k, the analog conversion signal being constituted by the total current $I_s$ flowing in the load line.

2. Digital/analog converter according to claim 1, characterized in that potentiometers are inserted in the emitter resistors.

3. Digital/analog converter according to any one of the claims 1 to 2, characterized in that for the high weight bits of the digital signal the inputs of a plurality of adjacent logic gates are connected in parallel to constitute a single input to which is applied said high weight bit.

* * * * *